United States Patent [19]

van de Plassche et al.

[11] Patent Number: 4,490,714
[45] Date of Patent: Dec. 25, 1984

[54] DIGITAL-TO-ANALOG CONVERTER FOR BIPOLAR SIGNALS

[75] Inventors: Rudy J. van de Plassche; Eise C. Dijkmans, both of Eindhoven, Netherlands

[73] Assignee: U.S. Philips Corporation, New York, N.Y.

[21] Appl. No.: 576,988

[22] Filed: Feb. 6, 1984

Related U.S. Application Data

[63] Continuation of Ser. No. 313,445, Oct. 21, 1981, abandoned.

[30] Foreign Application Priority Data

May 7, 1981 [NL] Netherlands ......................... 8102226

[51] Int. Cl.$^3$ ............................................ H03K 13/02
[52] U.S. Cl. ...................... 340/347 DA; 340/347 CC
[58] Field of Search ................ 340/347 DA, 347 DD, 340/347 CC

[56] References Cited

U.S. PATENT DOCUMENTS 4,346,368  8/1982  Johnson ....................... 340/347 DA

OTHER PUBLICATIONS

Siegel, "Understanding Digital Computers" ©1961, pp. 45-50.

*Primary Examiner*—C. D. Miller
*Attorney, Agent, or Firm*—Thomas A. Briody; William J. Streeter

[57] ABSTRACT

In a digital-to-analog converter for bipolar signals all the bits change when the signals pass through the zero level. This results in a poor signal-to-noise ratio owing the small signal and the large noise contribution by the switching transients. The invention proposes to add a digital number to or subtract it from the digital input signal as an offset. As a result of this, the switching point is shifted towards a higher amplitude, which improves the signal-to-noise ratio and the distortion in the case of digital audio signals.

1 Claim, 3 Drawing Figures

DIGITAL-TO-ANALOG CONVERTER FOR BIPOLAR SIGNALS

This is a continuation of application Ser. No. 313,445 filed Oct. 21, 1981, now abandoned.

BACKGROUND OF THE INVENTION

1. Field of the Invention

The invention relates to a digital-to-analog converter for bipolar signals, the value of the most significant bit changing when the signal passes through the zero level, which converter comprises n inputs for n bits to be converted, at least n switches, which are connected to the n inputs and which switch analog reference quantities, which together determine the analog value, which is available on an output of the converter, and means for eliminating the influence of switching transients on the analog value when the bits change in value.

2. Description of the Prior Art

Such a digital to-analog converter is known from the article by F. Maddens and M. Quintin, entitled: "Digital to analog converter for low level PCM signals" in IBM Technical Disclosure Bulletin, Vol. 17, No. 5, October 1974, pages 1383 and 1384. The article gives a solution to the problem of the poor signal-to-noise ratio at small signal values during passage of the zero level of the signal. All bits are then switched and change in digital value. If, as is customary, a switch which switches an analog quantity, is connected to each bit cell, an equal number of analog quantities can be switched on and off. Different switching times and delays give rise to switching transients on the analog output signal. The sum of said transients represents an additional signal, which is added to each changing input signal which passes through zero. For example, in the case of sine wave signals, such as audio signals, this contribution results in increased distortion and a reduction of the signal-to-noise ratio. In the known digital-to-analog converter this problem is solved by means of logic circuits arranged between the bit inputs, so that for the n bit inputs n+m switching lines are obtained which each actuate a switching transistor for switching on and off a current, which via a resistor network produces an analog voltage, which no longer has the stepped binary waveform. Thus, it is avoided that switching n bits also results in n analog quantities being switched. The digital-to-analog converter which is described is a 3-bit converter. For more bits the number of digital circuits becomes uneconomically large, while moreover a special resisitor network must be used.

SUMMARY OF THE INVENTION

The invention proposes to improve the distortion and signal-to-noise ratio with a smaller number of elements, regardless of the number of bits and using a conventional binary digital-to-analog converter.

To achieve this use is made of the recognition that both the distortion and the signal-to-noise ratio will improve if the actual signal is larger while the spurious signals, in the present case switching transients, remain equal. To this end a digital-to-analog converter of the type mentioned in the opening paragraph is characterized in that the said means comprises a generator, which generates a digital number and which is arranged between the said inputs and the switches and thereby provides a digital offset.

Said digital offset results in a specific digital number being added to or subtracted from the digital signal which is applied. This means that the centre of the analog range, which is adjusted by means of the most significant bit, for which consequently all n bits may change in value, is now situated at a higher amplitude of the applied signal. The value of the digital offset may for example be 1 to 3%, so that the digital number to be generated is situated near the fourth bit=16=6%, the fifth bit=32=3% or the sixth bit=64=1.5% reckoned from the most significant bit.

Since the digital-to-analog converter in accordance with the invention thus has an internal digital offset, the output will be a corresponding analog signal. If this is not desirable an analog source of opposite sign may be arranged at the output, so that an applied signal of the value zero also results in an analog zero signal.

An embodiment of the digital-to-analog converter is characterized in that an analog compensation source is coupled to the output in order to compensate for the digital offset.

A further embodiment is characterized in that the generator comprises an adder, of which a number of inputs are connected to an equal number of converter inputs corresponding to the most significant bits, of which an equal number of further inputs are connected to points of a potential corresponding to the digital number, and of which an equal number of outputs are connected to those switches which switch the most significant reference quantities.

In this respect it is advantageous that the digital-to-analog converter can be built by means of standard elements. The only addition is formed by one or two elements known and available as "4-bit-full adder".

DESCRIPTION OF THE DRAWING

The invention will now be described in more detail with reference to the drawing wherein

In FIG. 1 the invention is illustrated in 3 diagrams a, b and c. Column 1 in FIG. 1a represents the range of the bipolar digital input signal in analog form. The zero point is situated in the centre of the scale and thus corresponds to the value 1 for the most significant bit and the value 0 for all the other bits. Passage through said zero level consequently means that all n bits will change, namely the most significant bit becomes 0 and all the other n−1 bits become 1. Column 2 in FIG. 1a represents the analog scale of the digital-to-analog converter. The broken lines 4 and 4' indicate that the "digital" input scale 1 corresponds to the analog output scale 2.

In FIG. 1b the step in accordance with the invention has been applied. To the digital values of column 1 as applied to the input a digital number 5 is added. The combination 1+5 is converted from digital to analog form as is representd by column 2. The centre of column 2, designated M, now represents the point at which all bits change. However, this point is reached for a "negative" value of the input signal, as represented by the broken line 6 between column 1 and column 2. By a suitable choice this value can be optimized depending on the application and on the building elements used.

In FIG. 1c a digital number 7 is subtracted from the input signal in accordance with column 1. Now the centre M is situated at a positive value of the input signal. Moreover, column 3 indicates that the digital offset 7 can be compensated for by means of an oppositely directed analog offset. This may be of importance when the analog output signal is d.c. coupled to a further signal processing device to be connected to the output. Point M of the scale may then be the original zero point, which is shifted to point 0 of column 3. Columns 1 and 3 of FIG. 1c also show that a part of the range corresponding to the digital number 7 is no longer available for driving. As already stated, this number is only a few percent of the range, which for example in the case of audio applications hardly affects the maximum drive.

FIG. 2 schematically represents the improvement in signal-to-noise ratio that can be obtained. The amplitude of a sinewave signal S is plotted along the horizontal logarithmic axis. The signal-to-noise ratio is plotted along the vertical logarithmic axis. At the location where the sinewave signal passes through zero the largest switching transients occur and contribute to the noise. As is indicated by the line 8 the signal-to-noise ratio will increase from signal 0 according as the signal S increases. However, when at small value the signal starts with a much smaller noise level because the largest contribution is absent, a level 9 below which the signal-to-noise ratio does not decrease may be indicated in FIG. 2. In the case of larger signals the ratio becomes increasingly more favourable, as is represented by the line 10. However, if for the signal $S_1$ the level is reached at which all n bits are changed the signal-to-noise ratio decreases to point 11 and at larger signals the line 8 is followed again.

FIG. 3 represents the circuit diagram of the digital-to-analog converter in accordance with the invention. It comprises the converter section B, which is for example described in the article "D/A conversion" by H. Schmid in "Electronic Design", 22, October 1968, page 52, FIG. 4 and page 53, FIG. 6, and the generator A for the digital offset. The converter section B comprises the digital inputs $D_1$ to $D_n$, which control the switches $T_1$ to $T_n$. When the switches T are closed, binary scaled resistors R are connected to the summing point 12 of an amplifier 13 and to a reference supply +E. The amplifier 13 receives negative feed-back from the output 15 to the input 12 via a resistor $R_f$, while the input 14 is connected to earth. The output voltage of the amplifier is adjustable between 0 and $-E(R_f/R)$. If a resistor R is arranged between point 12 and the reference supply $-E$, the output voltage of the amplifier will be adjustable from $-E(R_f/R)$ via zero $E(R_f/R)$. In the last-mentioned case, the zero point on the output 15 can be shifted to a negative value with the resistor Rx and to a positive value with a resistor Ry. If the resulting analog signal should be capacitively available, a capacitor 16 is included. The alternating signal is then available on output 17.

Figure 1:
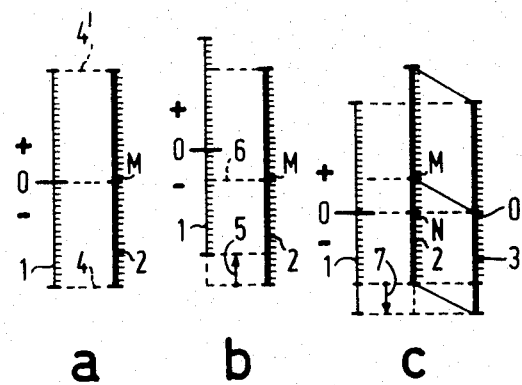
FIG. 1 illustrates the step in accordance with the invention.
Figure 2:
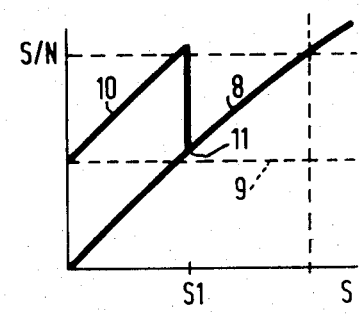
FIG. 2 represents the improvement.
Figure 3:
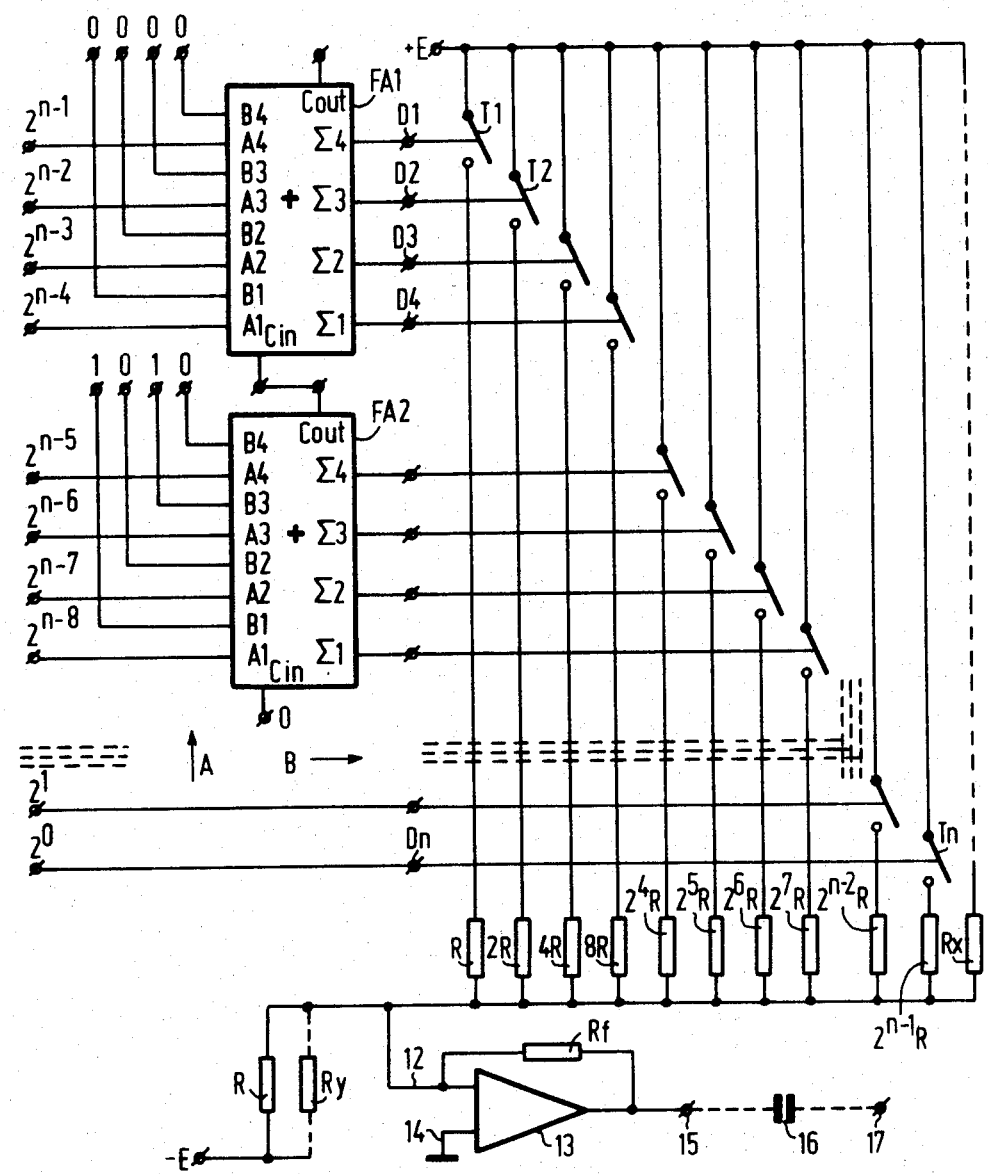
FIG. 3 shows an elaborate circuit diagram.

The generator section A in FIG. 3 is arranged between the digital inputs, designated $2^{n-1}, 2^{n-2}$ to $2^1, 2^0$, of the digital-to-analog converter and the digital inputs $D_1, D_2$ to $D_n$ of the converter section B. As is apparent from the Figure, many inputs $2^n$ may be interconnected to the corresponding inputs $D_{n-m}$. By the use of two "4 bit full adders" FA1 and FA2, for example Signetics type 54/7483 or 54LS/74LS83A, each number can be set with an accuracy of 8 bits. Generally this accuracy is not required and FA2 may even be dispensed with when a number 0001 suffices. The desired number can be set by means of potentials representing the digital values 0 and 1. By way of example the numbered 0000.0101 is represented in the Figure. This corresponds to substantially 2% of the range. For subtracting a number a slightly more intricate circuit is required. However, the techniques are similar to those applied in the elements FA1 and FA2.

It is alternatively possible to employ shift registers for the generator of the digital number, but in that case a serial converter should be used, while in FIG. 3 a parallel converter is illustrated.

What is claimed is:

1. A digital-to-analog converter for bipolar signals wherein the value of the most significant bit changes when the signal passes through the zero level, said converter comprising n inputs for n bits to be converted, at least n switches connected to the n inputs and which switch analog reference quantities to determine an analog value available on an output of the converter, means for eliminating the influence of switching transients on the analog value when the bits change in value, said means comprising a generator for generating a digital offset number, a binary adder connected between said inputs and said switches and to said generator for adding the digital offset number from said generator to the digital number to be converted, and an analog compensation source coupled to the output of said converter to compensate for the digital offset.

* * * * *